United States Patent
Krivokapic et al.

(10) Patent No.: US 6,555,879 B1
(45) Date of Patent: Apr. 29, 2003

(54) SOI DEVICE WITH METAL SOURCE/DRAIN AND METHOD OF FABRICATION

(75) Inventors: Zoran Krivokapic, Santa Clara, CA (US); Qi Xiang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/044,247

(22) Filed: Jan. 11, 2002

(51) Int. Cl.$^7$ ................................. H01L 29/76
(52) U.S. Cl. .................. 257/382; 257/347; 257/407; 257/369; 257/412
(58) Field of Search ................. 257/410, 411, 257/382, 383, 384, 347, 412, 369, 407

(56) References Cited

U.S. PATENT DOCUMENTS

| | | | |
|---|---|---|---|
| 4,942,441 A | * 7/1990 | Konishi et al. | ............. 257/384 |
| 5,989,957 A | 11/1999 | Ngo et al. | |
| 6,013,553 A | 1/2000 | Wallace et al. | |
| 6,020,024 A | 2/2000 | Maiti et al. | |
| 6,100,204 A | 8/2000 | Gardner et al. | |
| 6,210,999 B1 | 4/2001 | Gardner et al. | |
| 6,395,589 B1 | * 5/2002 | Yu | ............................... 438/183 |
| 6,441,433 B1 | * 8/2002 | En et al. | ..................... 257/344 |

* cited by examiner

Primary Examiner—Mark V. Prenty
(74) Attorney, Agent, or Firm—Renner, Otto, Boisselle & Sklar, LLP

(57) ABSTRACT

A MOSFET and method of fabrication. The MOSFET includes a metal containing source and a metal containing drain; a semiconductor body having a thickness of less than about 15 nm disposed between the source and the drain and on top of an insulating layer, the insulating layer formed on a substrate; a gate electrode disposed over the body and defining a channel interposed between the source and the drain; and a gate dielectric made from a high-K material and separating the gate electrode and the body.

19 Claims, 3 Drawing Sheets

SOI DEVICE WITH METAL SOURCE/DRAIN AND METHOD OF FABRICATION

TECHNICAL FIELD

The present invention relates generally to semiconductor devices and the fabrication thereof and, more particularly, to a semiconductor device having a metal source and drain.

BACKGROUND

A pervasive trend in modern integrated circuit manufacture is to produce semiconductor devices, such as metal oxide semiconductor field effect transistors (MOSFETs), that are as small as possible. In a typical MOSFET, a source and a drain are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on an insulating layer that is, in turn, disposed on a silicon substrate).

Although the fabrication of smaller transistors allows more transistors to be placed on a single monolithic substrate for the formation of relatively large circuit systems in a relatively small die area, this downscaling can result in a number of performance degrading effects. For example, in SOI devices with a thin body (e.g., about 15 nm or less), parasitic resistance can impede device operation. In addition, certain materials selected to be used in such a device may react with other materials when a thermal budget for the materials is exceeded (for example and depending on the material, when an anneal cycle approaches about 1000° C.).

Accordingly, there exists a need in the art for semiconductor devices, such as MOSFETs, that optimize scale and performance. There also exists a need for corresponding fabrication techniques to make those semiconductor devices.

SUMMARY OF THE INVENTION

According to one aspect of the invention, a MOSFET including a metal containing source and a metal containing drain; a semiconductor body having a thickness of less than about 15 nm disposed between the source and the drain and on top of an insulating layer, the insulating layer formed on a substrate; a gate electrode disposed over the body and defining a channel interposed between the source and the drain; and a gate dielectric made from a high-K material and separating the gate electrode and the body.

According to another aspect of the invention, a method of fabricating a MOSFET comprising providing a wafer including a layer of semiconductor material having a thickness of less than about 15 nm and formed on a layer of insulating material, the layer of insulating material formed on a substrate; forming a layer of high-K dielectric material over the layer of semiconductor material; forming a gate electrode over the layer of high-K material; removing a portion of the layer of high-K dielectric material extending laterally beyond the gate electrode; and siliciding the layer of semiconductor material to form a metal containing source and a metal containing drain, thereby forming a semiconductor body therebetween having a channel defined by the gate electrode.

BRIEF DESCRIPTION OF DRAWINGS

These and further features of the present invention will be apparent with reference to the following description and drawings, wherein.

DISCLOSURE OF INVENTION

Figure 1:
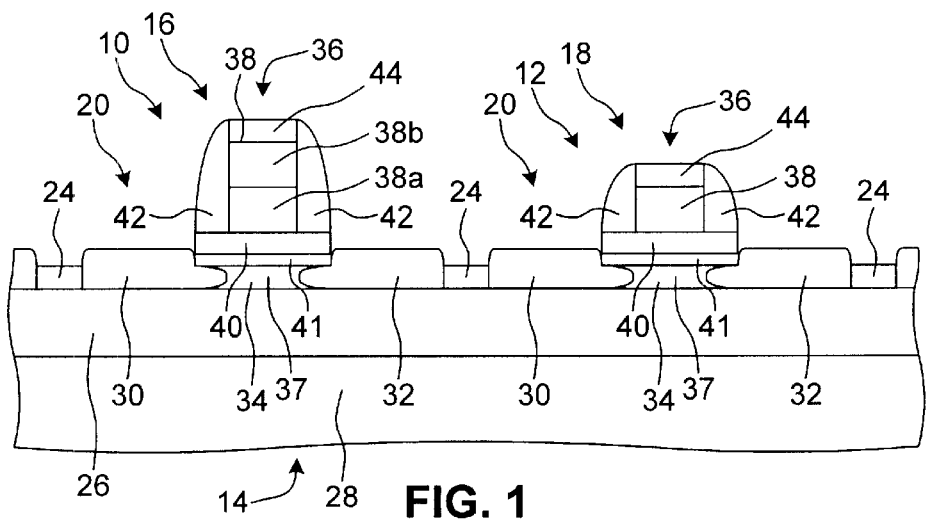
FIG. 1 is a schematic block diagram of a wafer having an NMOS device and a PMOS device formed thereon in accordance with one aspect of the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, a first semiconductor device 10 and a second semiconductor device 12 fabricated on a wafer 14 according to an example embodiment of the present invention is illustrated. The illustrated semiconductor devices 10 and 12 are MOSFETs used, for example, in the construction of a complimentary metal oxide semiconductor (CMOS) integrated circuit. As one skilled in the art will appreciate, the structures and the techniques for fabricating the semiconductor devices 10 and 12 described herein can be used for other types of semiconductors (e.g., other types of transistors, memory cells, etc.) and the illustrated MOSFETs are merely exemplary. However, to clearly and concisely set forth the present invention, the semiconductor device 10 is illustrated as an NMOS device and will be referred to herein as NMOS device 16. Similarly, semiconductor device 12 is illustrated as a PMOS device and will be referred to herein as PMOS device 18. Although only one NMOS device 16 and one PMOS device 18 is illustrated, one skilled in the art will appreciate that the illustrated devices are merely exemplary and multiple NMOS devices 16 and/or PMOS devices 18 can be formed on the wafer 14.

Figure 3A:
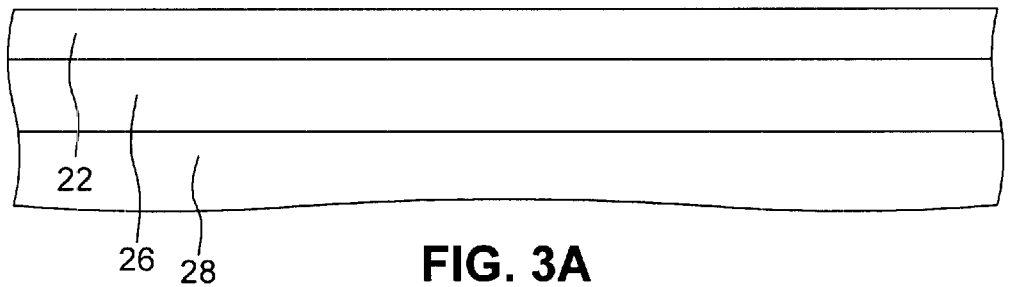
FIGS. 3A through 3F illustrate the wafer of FIG. 1 in various stages of manufacture.

Each of the NMOS device 16 and the PMOS device 18 is formed using an active region 20 formed in a layer of semiconductor material 22 (FIG. 3A) and defined by isolation regions 24. As illustrated, the layer of semiconductor material 22 can be a semiconductor film (for example, comprised of silicon, silicon-germanium, or the like) formed on a layer of insulating material 26 (for example, a buried oxide (BOX) layer). The insulating layer 26 is, in turn, formed on a semiconductor substrate 28 (also referred to in the art as a handle wafer) so that the resultant devices (e.g., semiconductor devices 10 and 12) are formed in a semiconductor-on-insulator (SOI) format.

The active region 20 for each of the NMOS device 16 and the PMOS device 18 includes a source 30, a drain 32 and a body 34 disposed between the source 30 and the drain 32. The source 30 and the drain 32 can be formed from a metal or metal-containing compound. In one embodiment of the invention, the source 30 and the drain 32 are formed by siliciding the layer of semiconductor material 22. Without intending to be bound by theory, a metal or metal containing source 30 and drain 32 provides for low parasitic resistance.

A gate 36 is disposed on the layer of semiconductor material 22 over the body 34 and defines a channel 37 within the body 34 (the channel 37 being interposed between the source 30 and the drain 32 and controlled by a work function of the gate 36). The gate 36 includes a gate electrode 38 spaced apart from the layer of semiconductor material 22 by a gate dielectric 40. The gate electrode 38 can be made from a metal (e.g., tungsten, tantalum, aluminum, nickel, ruthenium, rhodium, palladium, platinum, titanium, molybdenum, etc) or a metal containing compound (e.g., titanium nitride, tantalum nitride, etc.). If desired, a semiconductor (e.g., polycrystalline silicon, polycrystalline silicon-germanium, etc.) could also be used for the gate electrode 38.

In one embodiment, the gate dielectric 40 is made from a high-K material or stack of materials to form a high-K dielectric stack. As used herein, a "high-K material" or a "high-K dielectric material" refers to a material, or stack of materials, having a relative permittivity in one embodiment of about 10 or more, and in another embodiment of about 20 or more. Relative permittivity is the ratio of the absolute permittivity ($\epsilon$) found by measuring capacitance of the material to the permittivity of free space ($\epsilon_0$), that is $K=\epsilon/\epsilon_0$. High-K materials will be described in greater detail below. Although other materials can be selected for the gate dielectric 40, hafnium oxide (e.g., $HfO_2$), zirconium oxide (e.g., $ZrO_2$), cerium oxide ($CeO_2$), aluminum oxide (e.g., $Al_2O_3$), titanium oxide ($TiO_2$), yttrium oxide ($Y_2O_3$), barium strontium titanate (BST) are example suitable materials for the gate dielectric 40. In addition, all binary and ternary metal oxides and ferroelectric materials having a K higher than, in one embodiment, about twenty (20) can be used for the gate dielectric 40.

In an alternative embodiment, the gate dielectric 40 can be made from a standard-K material. As used herein, the term "standard-K dielectric material" or "standard-K dielectric material refers to a dielectric material having a relative permittivity, or K, of up to about 10. Example standard-K materials include, for example, silicon dioxide (K of about 3.9), silicon oxynitride (K of about 4 to 8 depending on the relative content of oxygen and nitrogen) and silicon nitride (K of about 6 to 9).

When a high-K material is selected as the gate dielectric 40, the high-K material can have an equivalent oxide thickness (EOT) of about one nanometer (1 nm) or less. In the semiconductor devices 10 and 12 described herein, a gate dielectric made from a high-K material may be desirable to minimize performance degrading effects, such as leakage, that may occur when the thickness of a standard-K dielectric material becomes thin (e.g., approaching about 1 nm). A high-K dielectric allows for the establishment of a suitable capacitance with a physically thicker dielectric layer. For example, a nitride gate dielectric having a K of about 7.8 and a thickness of about 10 nm is substantially electrically equivalent to an oxide gate dielectric having a K of about 3.9 and a thickness of about 5 nm. In addition, devices fabricated with a high-K dielectric layer tend to have improved reliability.

When a high-K material is selected as the gate dielectric 40, a buffer interface 41 can be used between the layer of semiconductor material 22 and the gate dielectric 40. The buffer interface 41 can be, for example, an oxide layer having a thickness of about 0.5 nm to about 0.7 nm. The buffer interface 41 acts to reduce diffusion and/or penetration of atoms from the high-K dielectric material into the layer of semiconductor material 22 that could lead to a degradation in channel mobility. In addition, the buffer interface 41 may act to retard reaction of the high-K material with the layer of semiconductor material 22.

As will be described in greater detail below, the gate electrode 38 for the NMOS device 16 can be made from the same material or from a different material that is used for the gate electrode 38 of the PMOS device 18. In the illustrated example, the NMOS device 16 has gate electrode 38 having multiple layers. A lower gate electrode portion 38a is used to define the work function of the gate 36 of the NMOS device 16. An upper layer 38b results from an example manufacturing process and is made from material used to form the gate 36 of the PMOS device 18. As one skilled in the art will appreciate, the manufacturing process can be altered to avoid fabricating the gate 36 with multiple layers.

The NMOS device 16 and the PMOS device 18 each can be provided with sidewall spacers 42, as is known in the art. Also, the NMOS device 16 and the PMOS device 18 each can optionally be provided with a gate electrode contact 44 used in establishing electrical connection to the gate electrode 38. If needed, source 30 and drain 32 contacts (not shown) can also be provided. Other components, such as a cap (or passivation) layer (not shown), vias, conductor lines and any other appropriate components to interconnect devices formed on the wafer 14, can also be provided.

Figure 2:
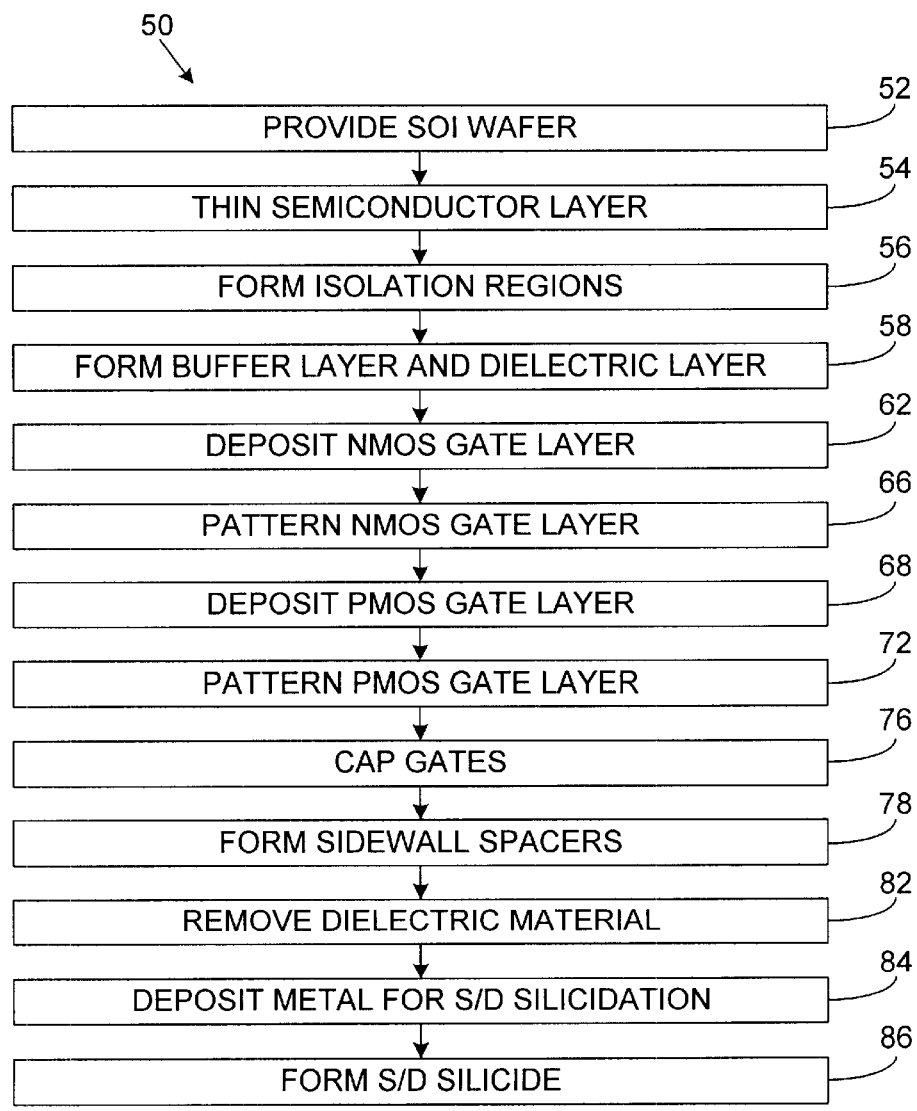
FIG. 2 is a flow chart illustrating a method of forming the wafer of FIG. 1.

Referring now to FIG. 2, a method 50 of forming the NMOS device 16 and the PMOS device 18 is illustrated. With additional reference to FIG. 3A, the method 50 starts in step 52 where the layer of semiconductor material 16 is provided. As indicated above, layer of semiconductor material 22 can be a semiconductor film (such as a silicon film or a silicon-germanium film) formed as part of a SOI substrate stack. In such an arrangement, the layer of semiconductor material 22 is formed on the insulating layer 26, which is formed on the semiconductor substrate 28. Alternatively, the layer of semiconductor material 22 can be a semiconductor substrate (such as a silicon substrate) for the formation of bulk-type devices.

Figure 3B:
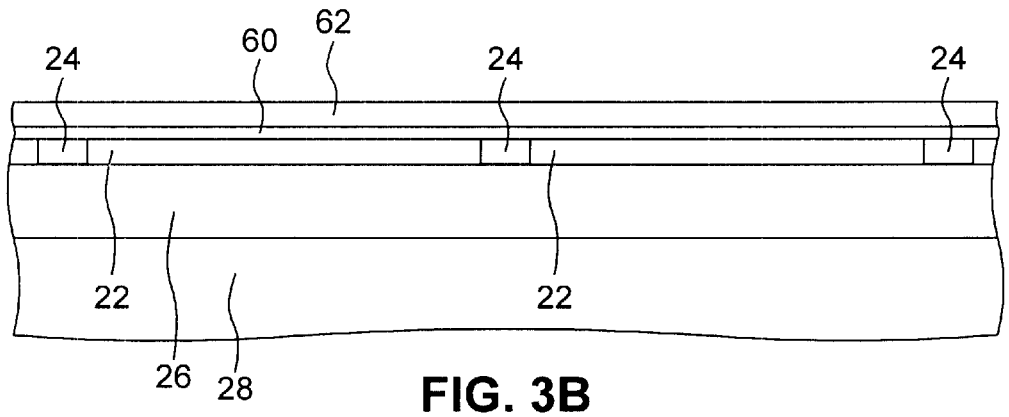

Next, in step 54 and as illustrated in FIG. 3B, the layer of semiconductor material 22 is thinned such that the resultant devices are fully depleted devices. In one embodiment the layer of semiconductor material 22 is thinned to less than about 15 nm, and in another embodiment the layer of semiconductor material 22 is thinned to about 5 nm to about 10 nm. The layer of semiconductor material 22 can be thinned by repeatedly oxidizing an upper region of the layer of semiconductor material 22 and stripping the oxidized portion by an appropriate etching or polishing technique until the desired thickness is achieved. Oxidizing of the layer of the semiconductor 22 can be carried out by any appropriate technique, including, for example, thermal oxidation or oxygen ion implantation and subsequent anneal. It is also noted that the layer of semiconductor material 22 can be doped for the formation of P-type body regions (e.g., for the formation of an N-channel device) and/or the formation of N-type body regions (e.g., for the formation of a P-channel device).

With continued reference to FIGS. 2 and 3B, in step 56 the isolation regions 24 can be formed. The isolation regions 24 define the size and placement of the active regions 20 (FIG. 1). The isolation regions 24 can be formed using a shallow trench isolation (STI) formation technique as is conventional. In an alternative embodiment, the isolation regions 24 can be formed prior to thinning of the layer of semiconductor material 22.

Next, in step 58, a buffer interface material layer 60 is formed on the layer of semiconductor material 22. As indicated, the buffer interface material layer 60 can be a thin layer of oxide. For example, the buffer interface material layer 60 can be a layer of silicon oxide that is about 0.5 nm to about 0.7 nm thick. The buffer interface layer can be formed by a low temperature (about 500° C.) thermal oxidation process, a remote plasma deposition process, an atomic layer deposition (ALD) process or the like. The buffer interface material layer 60 assists in reducing integration issues that may arise when attempting form a layer of high-K material on a semiconductor layer. Therefore, if the gate dielectric is formed from a standard-K material or if the buffer interface 41 is not desired, the buffer interface material layer 60 can be omitted.

Also in step 58, a layer of dielectric material 62 is formed on the buffer interface material layer 60 (if the buffer interface material layer 60 is omitted, the layer of dielectric material 62 can be formed on the layer of semiconductor material 22 or other intermediate layer formed in place of the buffer interface material layer 60). As indicated above, the layer of dielectric material 62 can be a standard-K dielectric material. Alternatively, the layer of dielectric material 62 is formed from a high-K dielectric material or a stack of materials that, in combination, have high-K dielectric properties.

Exemplary high-K materials are identified below in Table 1. It is noted that Table 1 is not an exhaustive list of high-K materials and other high-K materials may be available.

TABLE 1

| Dielectric Material | Approximate Relative Permittivity (K) |
|---|---|
| aluminum oxide ($Al_2O_3$) | 9–10 |
| zirconium silicate | 12 |
| hafnium silicate | 15 |
| hafnium silicon oxynitride | 16 |
| hafnium silicon nitride | 18 |
| lanthanum oxide ($La_2O_3$) | 20–30 |
| hafnium oxide ($HfO_2$) | 40 |
| zirconium oxide ($ZrO_2$) | 25 |
| cerium oxide ($CeO_2$) | 26 |
| bismuth silicon oxide ($Bi_4Si_2O_{12}$) | 35–75 |
| titanium dioxide ($TiO_2$) | 30 |
| tantalum oxide ($Ta_2O_5$) | 26 |
| tungsten oxide ($WO_3$) | 42 |
| yttrium oxide ($Y_2O_3$) | 20 |
| lanthanum aluminum oxide ($LaAlO_3$) | 25 |
| barium strontium titanate ($Ba_{1-x}Sr_xTiO_3$) | ~20–~200 |
| barium strontium oxide ($Ba_{1-x}Sr_xO_3$) | ~20–~200 |
| $PbTiO_3$ | ~20–~200 |
| barium titanate ($BaTiO_3$) | ~20–~200 |
| strontium titanate $SrTiO_3$ | ~20–~200 |
| $PbZrO_3$ | ~20–~200 |
| PST ($PbSc_xTa_{1-x}O_3$) | 3000 |
| PZN ($PbZn_xNb_{1-x}O_3$) | ~500–~5000 |
| PZT ($PbZr_xTi_{1-x}O_3$) | ~150–~1000 |
| PMN ($PbMg_xNb_{1-x}O_3$) | ~500–~5000 |

It is noted that the K-values for both standard-K and high-K materials may vary to some degree depending on the exact nature of the dielectric material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$, but may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula $Ta_2O_5$ is used, $Ta_xO_y$ is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Figure 3C:
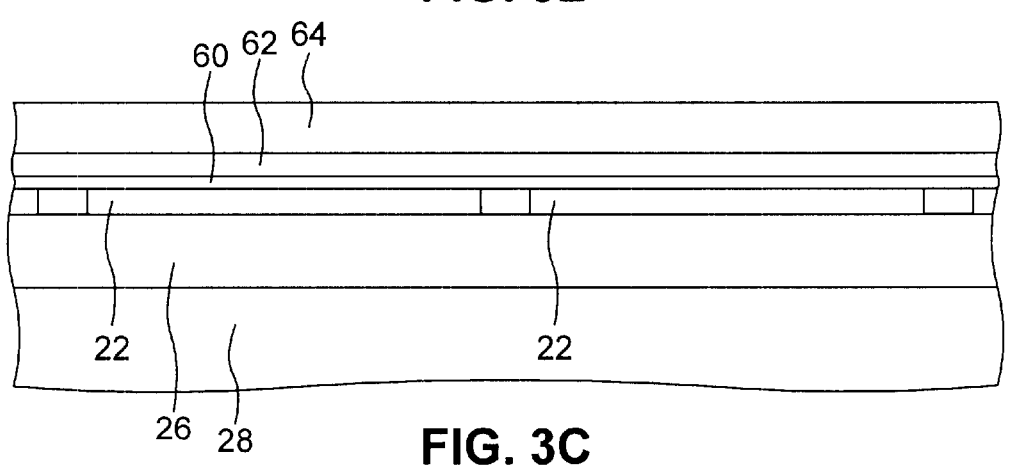

With reference to FIGS. 2 and 3C, the method 50 continues in step 62 where a first layer of gate electrode material 64 used to form the gate electrode 38 of the NMOS device 16 is formed on the layer of dielectric material 62. The layer of material 64 can be a metal appropriate for the gate electrode 38 of the NMOS device 16 (e.g., tungsten, tantalum, aluminum, etc.) or a metal containing compound (e.g., titanium nitride, tantalum nitride, etc.). If desired, a doped semiconductor (e.g., polycrystalline silicon, polycrystalline silicon-germanium, etc.) could alternatively be used. In one embodiment, the layer of material 64 is formed to have a thickness of about 25 nm or less.

Figure 3D:
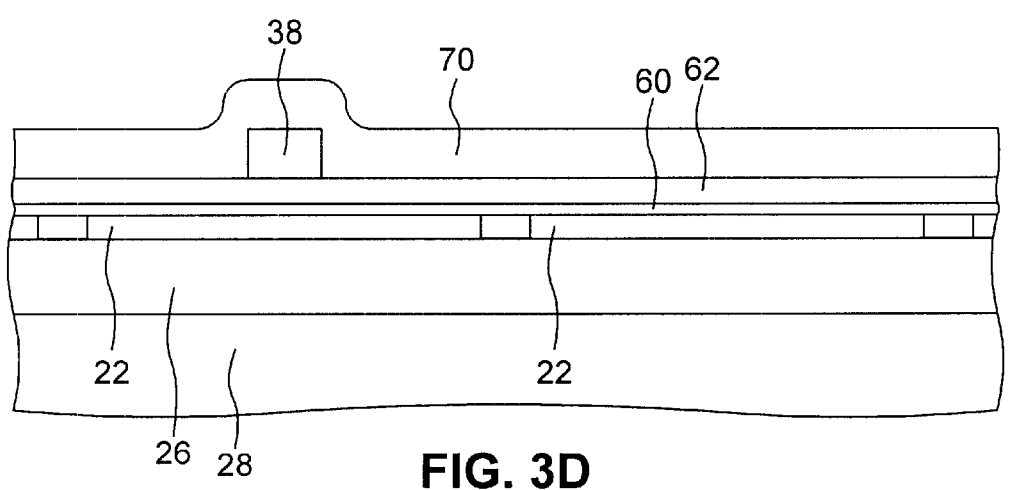

With additional reference to FIG. 3D, the layer of material 64 is then patterned using conventional techniques to form the gate electrode 38 of the NMOS device 16 in step 66. Patterning of the layer of material 64 can also be used to remove the layer of material 64 from areas of the wafer where the PMOS device 18 is to be formed. For example, a photoresist and wet etch can be used to pattern of the layer of material 64, but care should be taken to select an etchant with etch selectivity towards the layer of dielectric material 62. Depending on the compositions of the layer of material 64 and the layer of dielectric material 62, sulfuric acid ($H_2SO_4$) or nitric acid ($HNO_3$) may be appropriate etchants. Alternatively, and if appropriate, dry etching can be used to pattern the layer of material 64.

Thereafter, in step 68, a second layer of gate electrode material 70 used to form the gate electrode 38 of the PMOS device 18 is formed on the layer of dielectric material 62. The layer of material 64 can be a metal appropriate for the gate electrode 38 of the PMOS device 18 (e.g., tungsten, nickel, ruthenium, rhodium, palladium, platinum, etc.) or a metal containing compound (e.g., titanium nitride, tantalum nitride, etc.). If desired, a doped semiconductor (e.g., polycrystalline silicon, polycrystalline silicon-germanium, etc.) could alternatively be used. In one embodiment, the layer of material 64 is formed to have a thickness of about 25 nm or less.

Figure 3E:
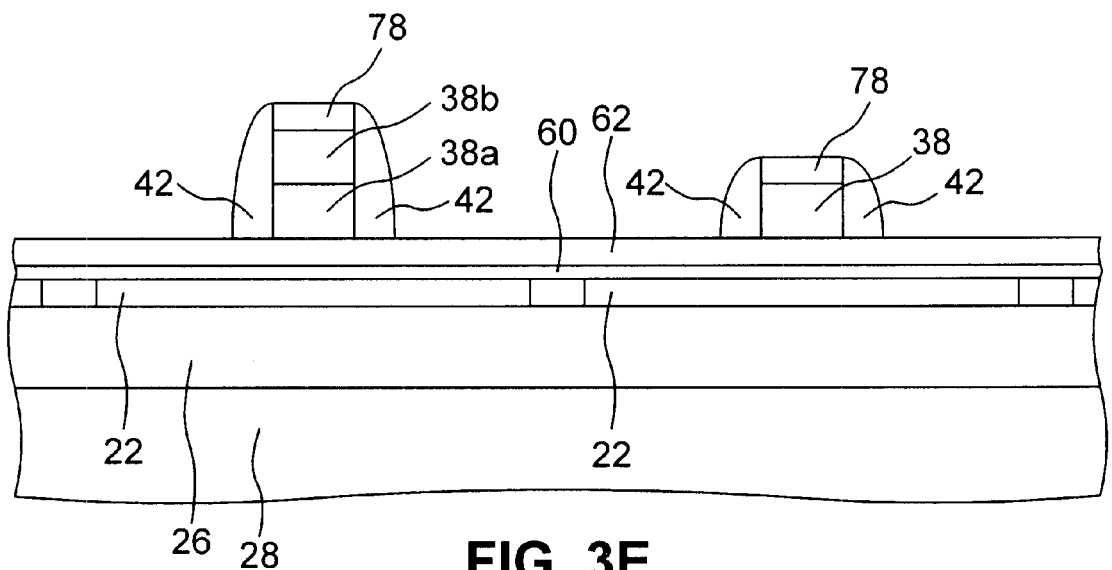

With additional reference to FIG. 3E, the layer of material 70 is then patterned using conventional techniques to form the gate electrode 38 of the PMOS device 18 in step 72. For example, a photoresist and wet etch can be used to pattern of the layer of material 64, but care should be taken to select an etchant with etch selectivity towards the layer of dielectric material 62. Depending on the compositions of the layer of material 64 and the layer of dielectric material 62, sulfuric acid ($H_2SO_4$) or nitric acid ($HNO_3$) may be appropriate etchants. Alternatively, and if appropriate, dry etching can be used to pattern the layer of material 70.

As illustrated in FIG. 3D, the layer of material 70 may be formed on the NMOS device 16 gate electrode 38. In this case, the layer of material 70 can be patterned to selectively remove the layer of material 70 from the NMOS device 16. Alternatively, and as shown in the illustrated embodiment, the layer of material 70 is removed such that the gate electrode 38 of the NMOS device 16 has the upper portion 38b made from the layer of material 70 which is disposed on the lower portion 38a made from the layer of material 64.

As one skilled in the art will appreciate, a number of alternative embodiments for the NMOS device 16 and/or the PMOS device 18 can be made by modifying the method 50. Each of those alternative embodiments are considered to fall within the scope of the claims appended hereto. One example embodiment includes placing a mask over the NMOS device 16 before formation of the layer of material 70 so that the layer of material 70 can be removed from the NMOS device 16. In this example, the NMOS device 16 gate electrode 38 will be comprised of material from the layer of material 64 and the PMOS device 18 gate electrode 38 will be comprised of material from the layer of material 70.

In another example embodiment, steps 62 and 66 are reversed with steps 68 and 72 such that the PMOS device 18 gate electrode 38 is formed with an upper portion and a lower portion.

In another example embodiment, the material selected for the gate electrodes 38 of both the NMOS device 16 and the PMOS device 18 is the same. In this example, appropriate materials can include mid-gap materials (e.g., a metal (such as tungsten) or metal-containing compound (such as titanium nitride) having a work function near the center of the band-gap (about 4.6 eV)). Alternatively, a semiconductor (e.g., polycrystalline silicon) can be used, but the NMOS device 16 gate electrode 38 should receive N+ doping and the PMOS device gate electrode 38 should receive P+ doping. In this example, only one deposition step and one patterning step may need to be completed.

In yet another example, in step 66 the layer of material 64 is removed from the PMOS device 18 area and step 72 is used to pattern the gate electrodes 38 of both the NMOS device 16 and the PMOS device 18.

With continued reference to FIGS. 2 and 3E, the method 50 continues in step 76 where a cap 78 is formed on each gate electrode 38. The caps 78 can be made from a dielectric material, such as silicon nitride. Techniques for forming the caps 78 are well known in the art and will not be described in detail.

Next, in step 78, the sidewall spacers 42 are formed. The spacers 42 are formed from a material such as silicon nitride. The formation of the spacers 42 is well known in the art and will not be described in greater detail.

Figure 3F:
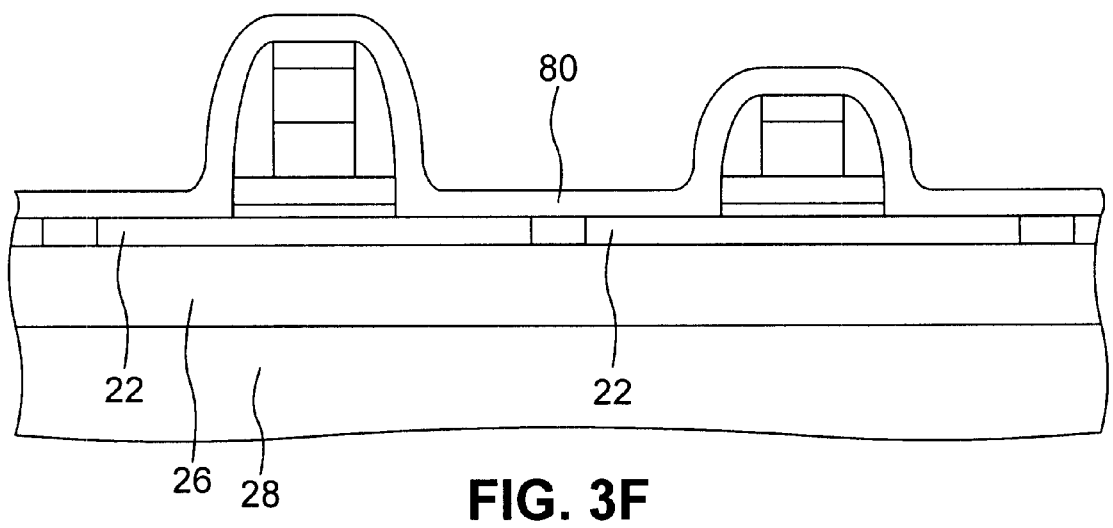

Referring now to FIGS. 2 and 3F, in step 82 portions of the layer of dielectric material 62 and the layer of buffer interface material 60 that extend beyond the gate electrode 38 and the spacers 42 are removed to expose the layer of semiconductor material 22. Step 82 is carried out in preparation to form the source 30 and the drain 32 from a silicide material. Removal of the undesired portions of the layer of dielectric material 62 and the layer of buffer interface material 60 will be well know to those skilled in the art and will not be described in detail.

Next, a conformal metal layer 80 used in the formation of silicide for the source 30 (FIG. 1) and the drain 32 (FIG. 1) is deposited in step 84. In one embodiment, the metal layer 80 is nickel (Ni). Alternatively, the metal layer 80 can be titanium, cobalt, platinum, molybdenum, or other suitable material for the formation of silicide sources 30 and drains 32. Deposition techniques for forming the metal layer 80, such as sputtering, are well known in the art and will not be described in greater detail.

Next, in step 84 and with additional reference to FIG. 1, the metal layer 80 is reacted with the layer of semiconductor material 22 to form silicide. In one embodiment, the layer of semiconductor material 22 is reacted down to the insulating layer 26. Although the spacers 42 and the gate 36 act as a self-aligned mask for silicide formation, the layer of semiconductor 22 can be reacted to form silicide extending at least partially under the spacers 42. In one embodiment, the layer of semiconductor material 22 can be reacted to form silicide extending partially under the gate electrode 38.

Thereafter, the gate cap 78 can be removed and the gate contact 44 can be formed. Thereafter, any additional processing to complete formation of the NMOS device 16 and/or the PMOS device 18, and/or to interconnect various devices formed on the wafer 14.

It is noted that many high-K materials can have a tendency to react with adjacent semiconductor material layers (e.g., the layer of semiconductor material 22 and/or the gate electrode 38 if made from a semiconductor material such as polycrystalline silicon) when a thermal budget for the high-K material is exceeded. In addition, exceeding a thermal budget for the high-K material may cause metal atoms to diffuse and/or penetrate into the layer of semiconductor material 22, which could degrade channel mobility. The semiconductor devices 10, 12 described herein are formed without ion implant implantation to form source and drain extension and deep implant regions. Ion implantation is usually followed by an associated anneal cycle(s) to activate those dopant species and/or to recrystalize the layer of semiconductor material. Therefore, the high-K materials used to form the gate dielectrics are not subjected to certain thermal processing typically carried out in the fabrication of many semiconductor devices. Without intending to be bound by theory, it is believed that the foregoing thermal budget issue is reduced for the semiconductor devices 10, 12 described herein.

The method 50 shows a specific order of steps for fabricating the NMOS device 16 and the PMOS device 18. However, it is understood that the order may differ from that depicted. For example, the order of two or more steps may be altered relative to the order shown. Also, two or more steps may be carried out concurrently or with partial concurrence. In addition, various steps may be omitted and other steps may be added. Furthermore, the method 50 can be modified for the formation of devices other than MOSFETs. It is understood that all such variations are within the scope of the present invention.

Although particular embodiments of the invention have been described in detail, it is understood that the invention is not limited correspondingly in scope, but includes all changes, modifications and equivalents coming within the spirit and terms of the claims appended hereto.

What is claimed is:

1. A MOSFET comprising:
   a metal containing source and a metal containing drain;
   a semiconductor body having a thickness of less than about 15 nm disposed between the source and the drain and on top of an insulating layer, the insulating layer formed on a substrate;
   a gate electrode disposed over the body and defining a channel interposed between the source and the drain; and
   a gate dielectric made from a high-K material and separating the gate electrode and the body;
   wherein the MOSFET is configured as an NMOS device; and wherein the gate electrode includes a lower portion defining a work function that controls the channel and an upper portion formed from a material used to form a gate of a nearby PMOS device.

2. The MOSFET according to claim 1, wherein the lower gate electrode portion is composed of one or more materials selected from titanium nitride, tantalum nitride, tungsten, tantalum, aluminum and combinations thereof.

3. The MOSFET according to claim 1, wherein the upper gate electrode portion is composed of one or more materials selected from titanium nitride, tantalum nitride, tungsten, nickel, ruthenium, rhodium, palladium, platinum and combinations thereof.

4. The MOSFET according to claim 1, wherein the high-K material is composed of one or more materials selected from hafnium oxide, zirconium oxide, cerium oxide, aluminum oxide, titanium oxide, yttrium oxide, barium strontium titanate and mixtures thereof.

5. The MOSFET according to claim 1, further comprising a buffer interface disposed between the body and the gate dielectric.

6. The MOSFET according to claim 5, wherein the buffer interface is formed from an oxide having a thickness of about 0.5 nm to about 0.7 nm.

7. A MOSFET comprising:
   a source having at least a portion comprising a metal and a drain having at least a portion comprising the metal;
   a semiconductor body having a thickness of less than about 15 nm disposed between the source and the drain and on top of an insulating layer, the insulating layer formed on a substrate, wherein the body forms junctions with the source portion comprising the metal and the drain portion comprising the metal;
   a gate electrode disposed over the body and defining a channel interposed between the source and the drain; and
   a gate dielectric made from a high-K material and separating the gate electrode and the body; and
   wherein the MOSFET is configured as an NMOS device.

8. The MOSFET according to claim 7, wherein the gate is made from a mid-gap material.

9. The MOSFET according to claim 7, wherein the gate electrode is composed of one or more materials selected from titanium nitride, tantalum nitride, tungsten, tantalum, aluminum and combinations thereof.

10. The MOSFET according to claim 7, wherein the gate electrode includes a lower portion defining a work function that controls the channel and an upper portion formed from a material used to form a gate of a nearby PMOS device.

11. The MOSFET according to claim 7, wherein the MOSFET is configured as a PMOS device.

12. The MOSFET according to claim 11, wherein the gate electrode is composed of one or more materials selected from titanium nitride, tantalum nitride, tungsten, nickel, ruthenium, rhodium, palladium, platinum and combinations thereof.

13. The MOSFET according to claim 7, wherein the high-K material is composed of one or more materials selected from hafnium oxide, zirconium oxide, cerium oxide, aluminum oxide, titanium oxide, yttrium oxide, barium strontium titanate and mixtures thereof.

14. The MOSFET according to claim 7, further comprising a buffer interface disposed between the body and the gate dielectric.

15. The MOSFET according to claim 14, wherein the buffer interface is formed from an oxide having a thickness of about 0.5 nm to about 0.7 nm.

16. The MOSFET according to claim 7, wherein the source portion comprising the metal and the drain portion comprising the metal are formed from a silicide.

17. The MOSFET according to claim 16, wherein the silicide is formed by reacting nickel with a layer of semiconductor material, the body being formed from the layer of semiconductor material.

18. The MOSFET according to claim 7, wherein the source portion comprising the metal and the drain portion comprising the metal respectively extend under sidewall spacers disposed adjacent the gate electrode.

19. The MOSFET according to claim 7, wherein the source portion comprising the metal and the drain portion comprising the metal extend downward to and contact the insulating layer.

* * * * *